(12) United States Patent
Matsumura et al.

(10) Patent No.: US 11,304,325 B2
(45) Date of Patent: Apr. 12, 2022

(54) CASE STRUCTURE

(71) Applicant: AISIN CORPORATION, Kariya (JP)

(72) Inventors: Naoki Matsumura, Nagoya (JP); Hidetoshi Yata, Ichinomiya (JP); Masanori Minoshima, Kariya (JP)

(73) Assignee: AISIN CORPORATION, Kariya (JP)

( * ) Notice: Subject to any disclaimer, the term of this patent is extended or adjusted under 35 U.S.C. 154(b) by 232 days.

(21) Appl. No.: 16/529,149

(22) Filed: Aug. 1, 2019

(65) Prior Publication Data
US 2020/0053898 A1 Feb. 13, 2020

(30) Foreign Application Priority Data

Aug. 10, 2018 (JP) .............................. JP2018-151912

(51) Int. Cl.
*G06F 1/16* (2006.01)
*H05K 5/00* (2006.01)
*H05K 7/00* (2006.01)
*H05K 7/14* (2006.01)
*H05K 5/02* (2006.01)

(52) U.S. Cl.
CPC .............. *H05K 7/1405* (2013.01); *H05K 5/02* (2013.01)

(58) Field of Classification Search
CPC .............. H05K 7/1405; H05K 7/1404; H05K 7/1401; H05K 7/1408; H05K 7/1409; H05K 5/02; H05K 5/02117; H05K 5/0221; H05K 5/0217
See application file for complete search history.

(56) References Cited

U.S. PATENT DOCUMENTS

| | | | | |
|---|---|---|---|---|
| 5,366,185 A | * | 11/1994 | Michael ................. | A47L 15/42 248/27.1 |
| 5,793,614 A | * | 8/1998 | Tollbom ............... | H05K 7/1409 361/725 |
| 7,144,258 B2 | * | 12/2006 | Ariga ................... | H05K 5/0039 439/76.1 |
| 7,417,868 B2 | | 8/2008 | Morisada | |
| 8,273,999 B2 | * | 9/2012 | Hirota .................. | H05K 5/0013 174/563 |
| 8,523,117 B2 | * | 9/2013 | Hirota .................. | H05K 7/1405 248/27.1 |
| 9,497,866 B2 | * | 11/2016 | Wakana ............... | H05K 5/0039 |
| 9,967,993 B1 | * | 5/2018 | Walker ................. | H05K 7/1418 |
| 10,492,324 B2 | * | 11/2019 | Miura .................. | H05K 7/1418 |
| 10,986,746 B2 | * | 4/2021 | Chao .................... | H05K 7/1427 |
| 11,097,615 B2 | * | 8/2021 | Tastekin ............... | B60K 37/06 |
| 2002/0012238 A1 | * | 1/2002 | Takahashi ........... | G02B 6/4452 361/796 |
| 2011/0248132 A1 | * | 10/2011 | Hirota ................. | H05K 7/1405 248/222.14 |

FOREIGN PATENT DOCUMENTS

JP 2006-019674 A 1/2006
JP 5060989 B2 10/2012

* cited by examiner

*Primary Examiner* — Anthony M Haughton
(74) *Attorney, Agent, or Firm* — Oblon, McClelland, Maier & Neustadt, L.L.P.

(57) ABSTRACT

A case structure includes: a case having an opening at one end side; a cover configured to close the opening; and a pressing and holding portion configured to press and hold a board against the case when the cover applies a force to the board in a state where the board is accommodated in the case and the cover is closed.

4 Claims, 8 Drawing Sheets

CASE STRUCTURE

CROSS REFERENCE TO RELATED APPLICATIONS

This application is based on and claims priority under 35 U.S.C. § 119 to Japanese Patent Application 2018-151912, filed on Aug. 10, 2018, the entire contents of which are incorporated herein by reference.

TECHNICAL FIELD

This disclosure relates to a case structure accommodating a board therein.

BACKGROUND DISCUSSION

As a case structure having the above-mentioned configuration, JP2006-019674A (Reference 1) discloses a technology in which a first guide protrusion is provided inside a case accommodating a board therein to perform positioning in the transverse direction which is the width direction of the board and a vertical positioning portion is provided on the inner surface of a cover which closes an opening portion in the end of the case to sandwich the board from the vertical direction which is the thickness direction of the board.

A vehicle having an internal combustion engine, such as an automobile, requires a board for controlling the internal combustion engine or a device provided in a vehicle body, and the board is provided in each part of the vehicle body in a state of being accommodated in a sealed case.

In the vehicle, the case may vibrate due to vibration during traveling. At this time, in a case where the board is not properly held inside the case and there is a gap between the board and a member holding the board, the board vibrates inside the case, thus causing generation of abnormal noise.

Here, considering the configuration of Reference 1, in Reference 1, the guide portion formed inside the case holds the board from the front end to the middle thereof in the insertion direction of the board, and the vertical positioning portion formed on the cover holds the rear end in the insertion direction of the board. However, in the configuration of Reference 1, since the cover and the case are fixed, but there is no configuration that integrally fixes the board, the case, and the cover, in a case where there is a gap between the case and the cover, the board may vibrate due to the gap when vibration is applied from the outside, which may cause generation of abnormal noise.

Thus, a need exists for a case structure which is not susceptible to the drawback mentioned above.

SUMMARY

A feature of a case structure according to an aspect of this disclosure resides in that the case structure includes a case having an opening at one end side, a cover configured to close the opening, and a pressing and holding portion configured to press and hold a board against the case when the cover applies a force to the board in a state where the board is accommodated in the case and the cover is closed.

According to this characteristic configuration, in a state where the board is accommodated in the case and the opening in the case is closed by the cover, the pressing and holding unit applies a force to the board and the board is pressed and held against the case by the force. Further, since a reaction force of the force applied to the board from the pressing and holding portion is applied to the cover in a state where the board is held on the case, relative displacement between the board and the cover may be prevented, and consequently, the board is held against the cover. In this way, in a state where the board is held by the case and the cover, for example, even if external vibration is transmitted to the board, the board does not displace relative to either the case or the cover, and a phenomenon of vibrating the board may also be prevented.

Thus, the case structure is configured to prevent vibration of the board with respect to any one of the case accommodating the board therein and the cover closing the opening in the case, thereby preventing generation of abnormal noise.

BRIEF DESCRIPTION OF THE DRAWINGS

The foregoing and additional features and characteristics of this disclosure will become more apparent from the following detailed description considered with the reference to the accompanying drawings, wherein.

DETAILED DESCRIPTION

Hereinafter, embodiments disclosed here will be described based on the accompanying drawings.

[Basic Configuration]

Figure 1:
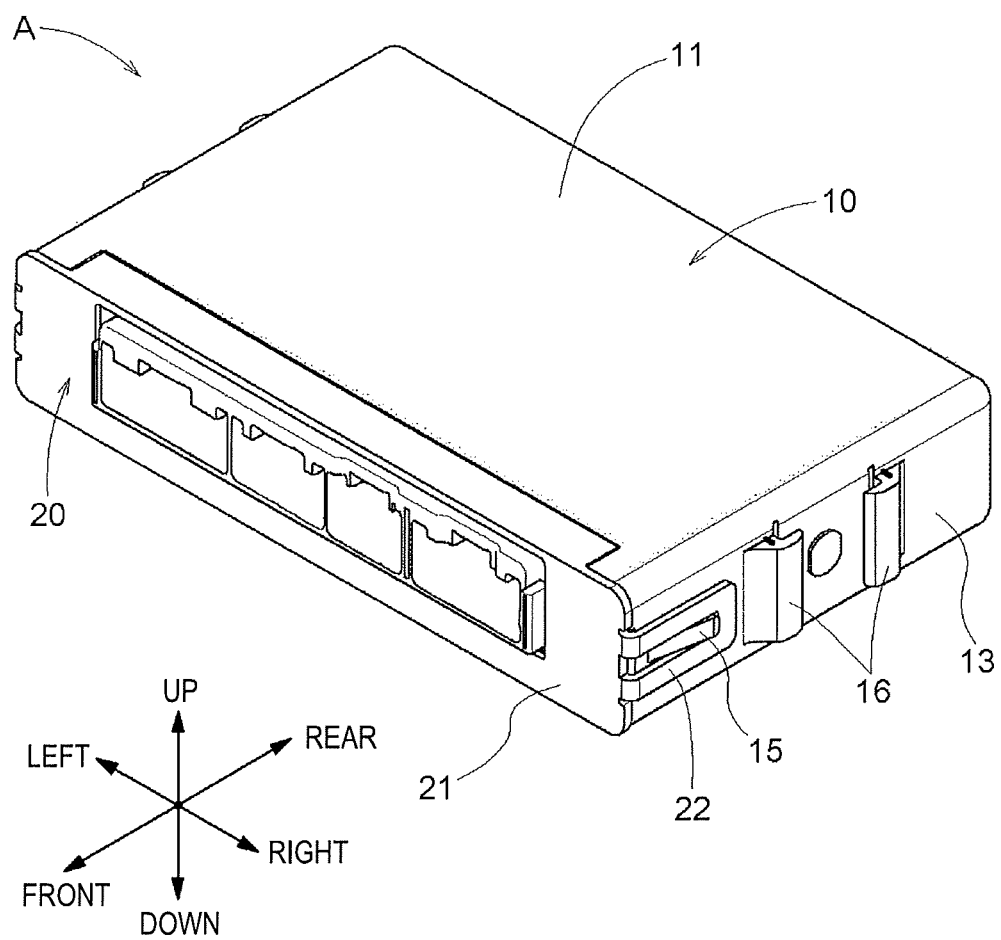
FIG. 1 is a perspective view illustrating an entire case structure.
Figure 2:
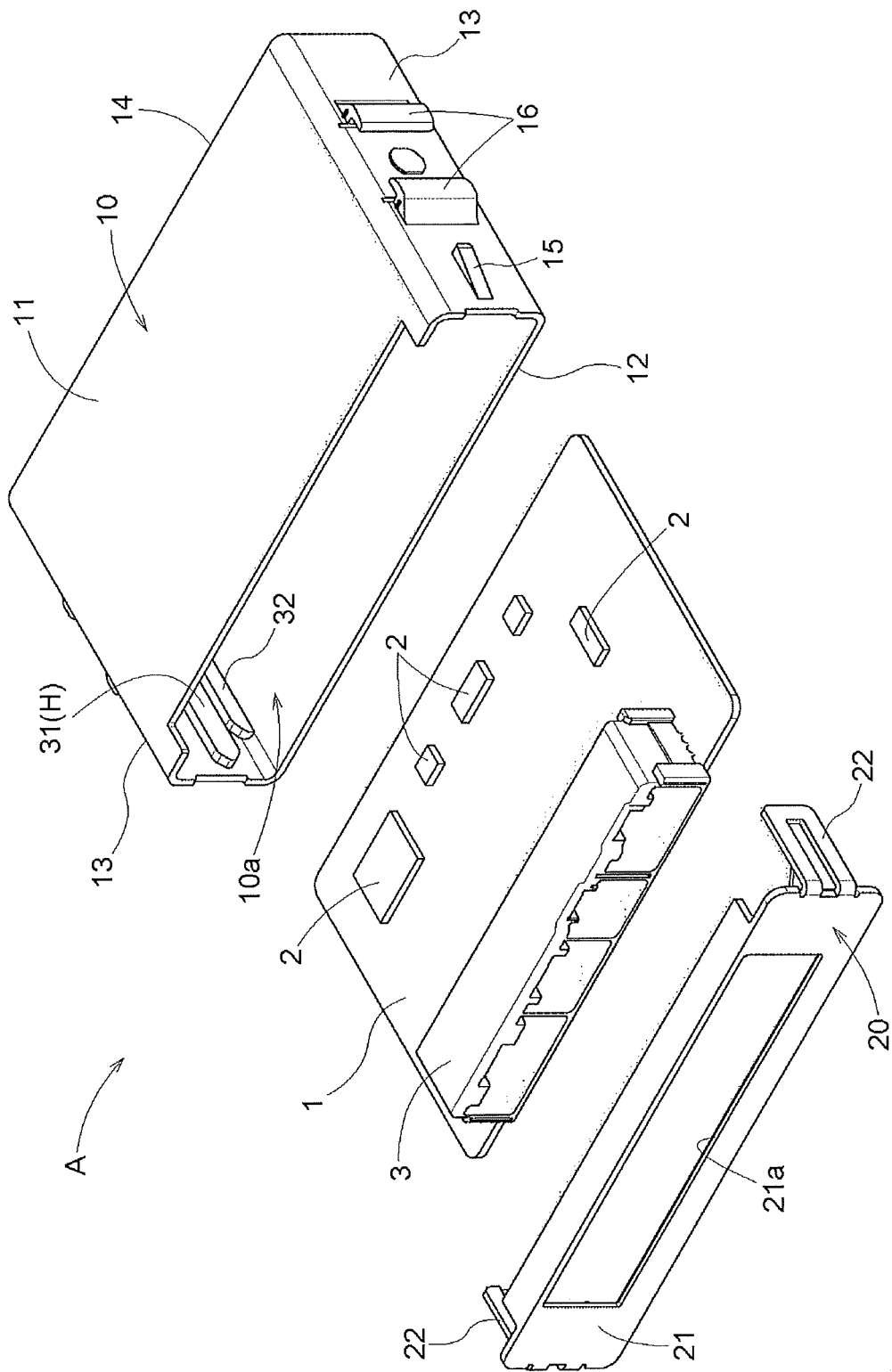
FIG. 2 is an exploded perspective view of the case structure viewed from the opening side of a case.
Figure 3:
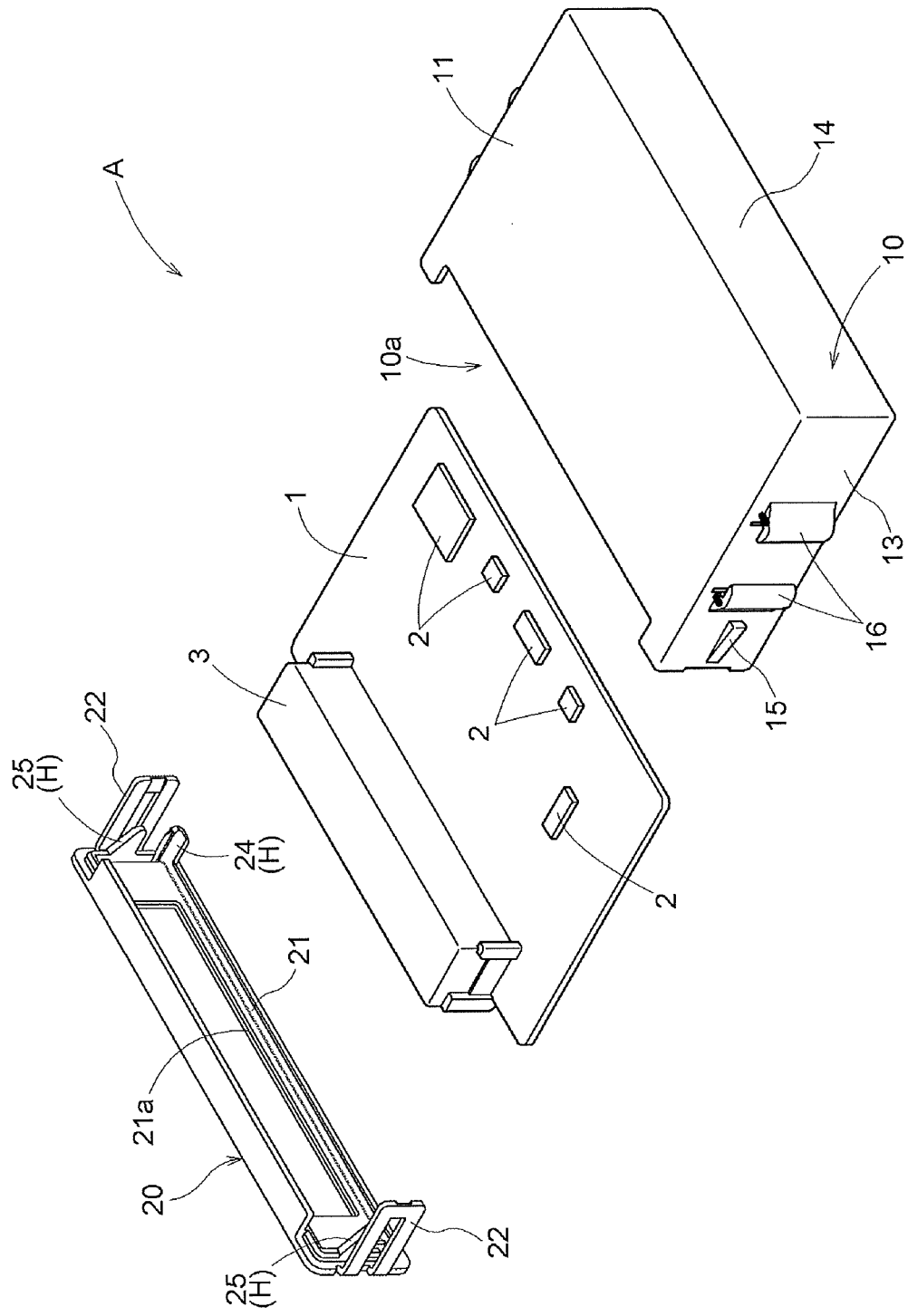
FIG. 3 is an exploded perspective view of the case structure viewed from the bottom wall side of the case.

As illustrated in FIGS. 1 to 3, a case structure A includes a resin case 10 which accommodates a board 1 therein and a resin cover 20 which closes an opening 10a in the case 10. The board 1 includes an electronic component 2 mounted thereon and a connector 3 connected to a printed wire to enable access of information to the mounted electronic component 2.

The case structure A is illustrated as accommodating the board 1 constituting an electronic control unit (ECU) which controls an engine in a vehicle such as an automobile, and information necessary for control is input to and output from the case structure A via a cable connected to the connector 3. Although the case structure A is supported by, for example, a vehicle body frame in an arbitrary posture, a positional relationship between respective parts will be described based on the posture illustrated in FIG. 1. In particular, a relationship between left and right sides, a relationship between upper and lower sides, and a relationship between front and rear sides are illustrated in FIG. 1.

[Case]

As illustrated in FIGS. 1 to 4, the case 10 has a bottomed rectangular cylindrical shape, and an upper wall 11, a lower wall 12, left and right sidewalls 13, and a bottom wall 14 connected thereto are integrally formed with each other. A rectangular opening 10a is formed at a position to face the bottom wall 14. Each sidewall 13 is formed on the outer surface thereof with an engagement protrusion 15 for engaging and holding a cover 20 and a holder 16 for holding a bracket (not illustrated) on the case 10 when the case structure A is supported on a vehicle body.

Figure 4:
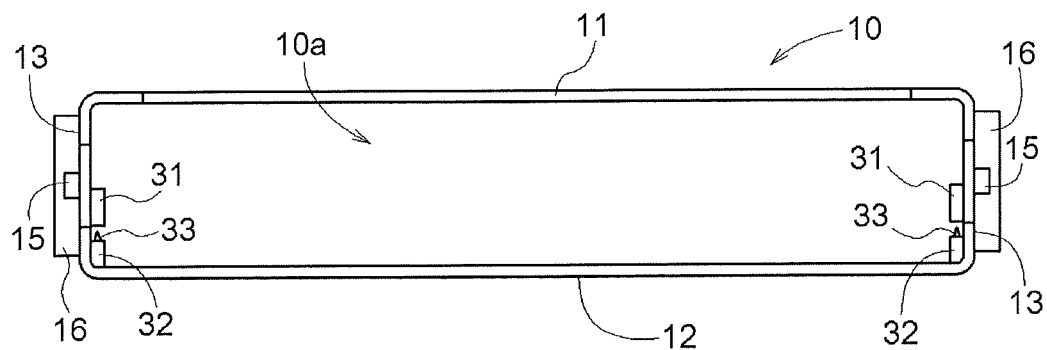
FIG. 4 is a front view of the case.
Figure 5:
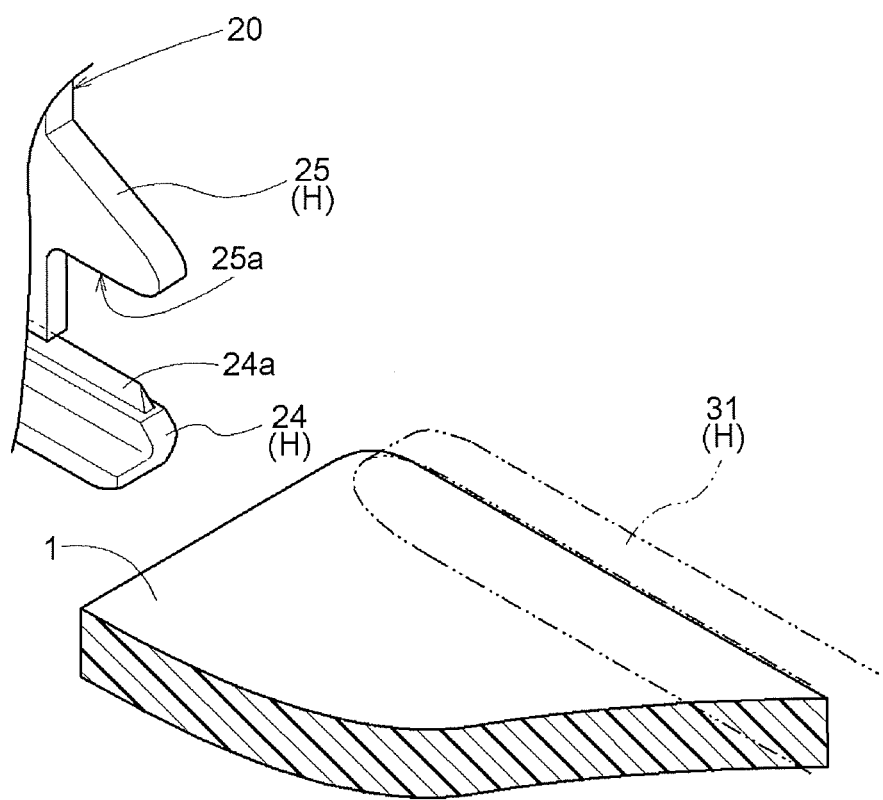
FIG. 5 is a perspective view illustrating a positional relationship between a pressing member and a regulating member.

Further, as illustrated in FIGS. 2 and 4, a main guide member 31 and a sub guide member 32 which are parallel to each other to have a rail shape are formed on the inner surface of each of the left and right side walls 13 to guide the board 1 along a guide path. The main guide member 31 and the sub guide member 32 are disposed at positions to face the upper surface side and the lower surface side of the board 1, respectively, along the guide path.

Figure 6:
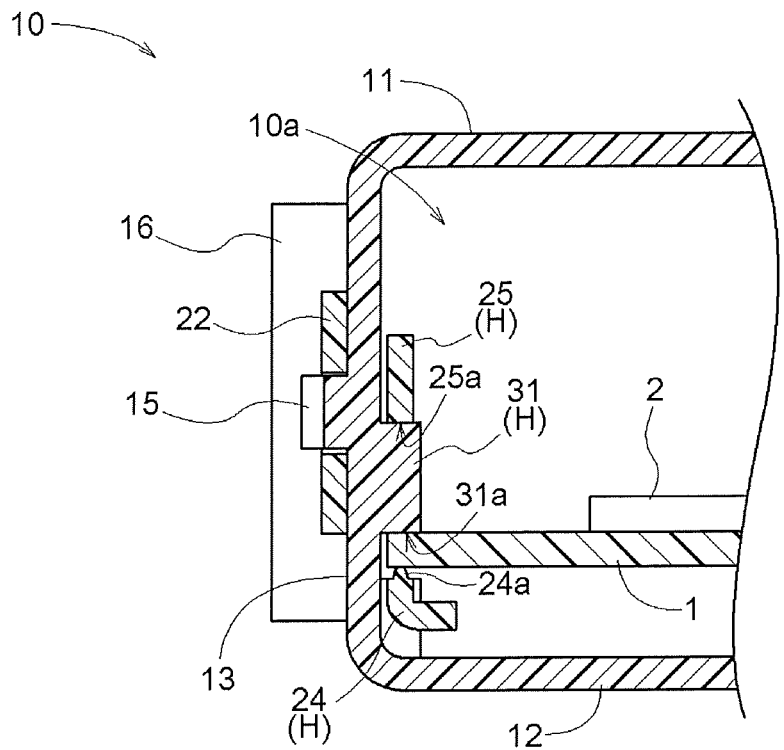
FIG. 6 is a cross-sectional view illustrating the pressing member, a board, a main guide member, and the regulating member.
Figure 7:
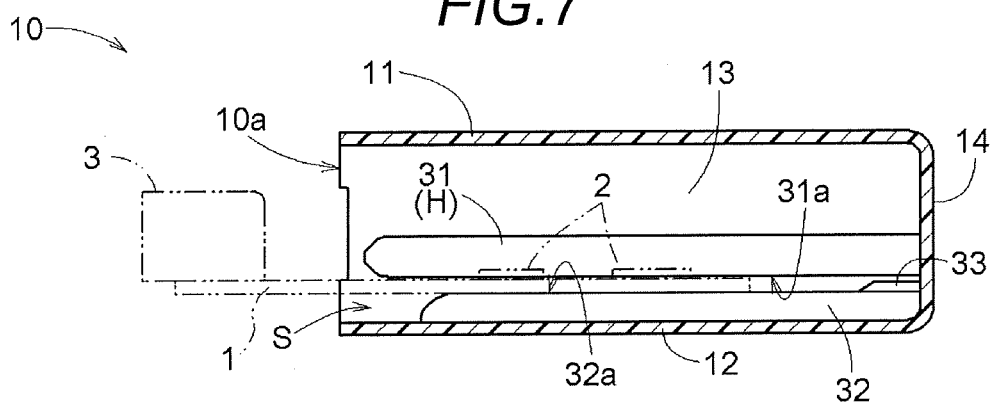
FIG. 7 is a longitudinal-sectional side view of the case.

As illustrated in FIGS. 6 and 7, a main guide surface 31a is formed on the lower side of the main guide member 31 (the surface facing the upper surface of the board 1), and a sub guide surface 32a is formed on the upper side of the sub guide member 32 (the surface facing the lower surface of the board 1). Meanwhile, the guide path is formed between the main guide surface 31a and the sub guide surface 32a. Further, the distance between the main guide surface 31a and the sub guide surface 32a is set to a value slightly larger than the thickness of the board 1.

Figure 8:
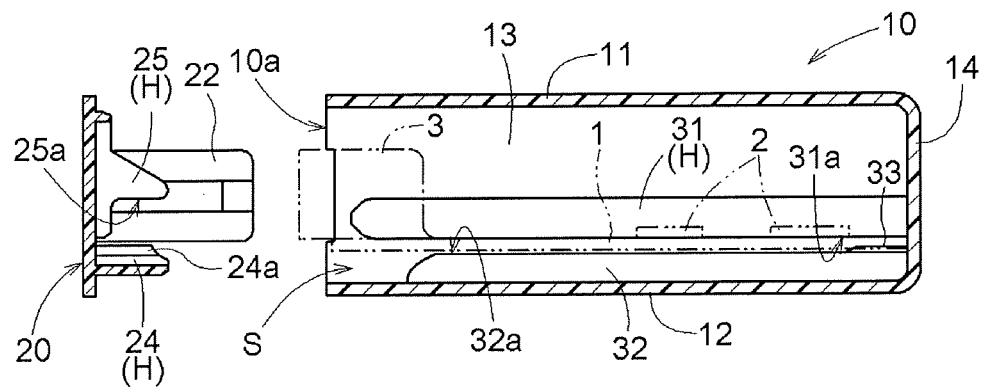
FIG. 8 is a longitudinal-sectional side view of the case and a cover in a state where the board is inserted into the case.
Figure 9:
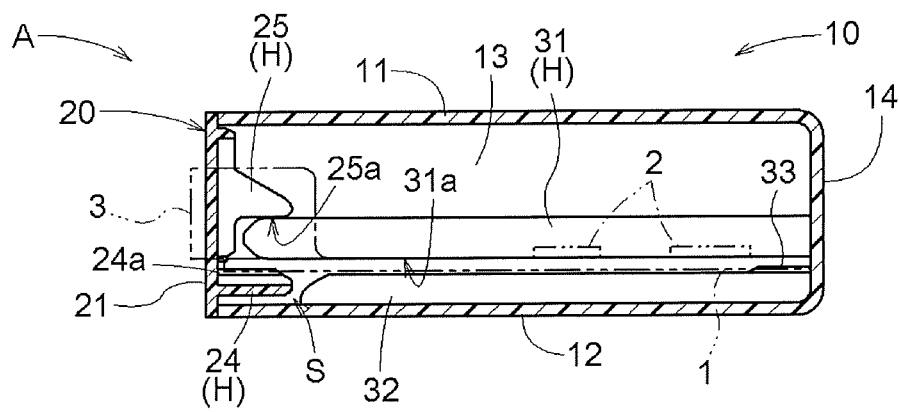
FIG. 9 is a longitudinal-sectional side view of the case structure in a state where an opening in the case is closed by the cover.

As illustrated in FIGS. 7 to 9, the length of the main guide member 31 in the guide direction is set so that the main guide member 31 extends from the bottom wall 14 to the vicinity of the opening 10a. The sub guide member 32 is formed in a shape in which a portion thereof close to the opening 10a is removed as compared with the main guide member 31. Thus, the sub guide member 32 has a length shorter than that of the main guide member 31 in the guide direction, and based on this length relationship, an open space S is formed at the outer end side (the side close to the opening 10a) of the sub guide member 32 below the main guide member 31.

As illustrated in FIG. 7, a projection 33 which abuts onto the lower surface side of the front end in the insertion direction of the board 1 when the board 1 is inserted into the case 10 is integrally formed on the sub guide member 32 so as to protrude upward from the sub guide member 32. Specifically, the projection 33 is formed on the middle of the sub guide member 32 to protrude upward from the sub guide surface 32a in the vicinity of the bottom wall 14. In this configuration, the distance between the protruding end of the projection 33 (the upper end in FIG. 7) and the main guide surface 31a is set to be slightly smaller than the thickness of the board 1. The projection 33 takes the form of a plate extending in a direction along the guide direction, and is formed such that the plate thickness of a base end portion thereof is large and the plate thickness (the length in the transverse direction) decreases toward the protruding end side.

From such a configuration, the board 1 is inserted between the main guide member 31 and the sub guide member 32 as illustrated by a two-dot chain line, and as illustrated in FIG. 8, an upper end portion of the projection 33 is crushed by the board 1 in a process of the board 1 reaching the insertion end, whereby insertion of the board 1 is permitted and the projection 33 is in strong contact with the lower surface of the board 1. Thus, a force is applied to the board 1 in the direction in which the board 1 is lifted upward to bring the upper surface of the board 1 into strong contact with the main guide surface 31a and maintain the board 1 in this pressed state.

[Cover]

As illustrated in FIGS. 1 to 3, the cover 20 is configured such that a cover body 21 disposed at the position at which it closes the opening 10a is integrally formed with a pair of left and right engagement connection members 22 which are engaged with the respective engagement protrusions 15 on the outer surfaces of the left and right sidewalls 13 of the case 10.

Further, the cover body 21 is formed with a hole 21a which exposes the outer end side of the connector 3 provided on the board 1. Meanwhile, each engagement connection member 22 remains in the engaged state with the engagement protrusion 15 by an elastic force of resin, and is configured to enable disengagement of the engagement protrusion 15 by an artificial operation.

In particular, as illustrated in FIGS. 3, 5, 8 and 9, a pressing member 24 and a regulating member 25 are formed on the inner surface side of either end in the transverse direction of the cover 20 to extend in a direction into the case 10.

The pressing member 24 is inserted to the inside of the case 10 from the opening 10a in the case 10 and is disposed at the position at which it is in contact with the lower surface side of the board 1 in a state where the cover 20 is provided at the position at which it closes the opening 10a in the case 10. Further, a pressing portion 24a having a plate shape is provided on the upper surface of the pressing member 24 so as to protrude upward. The pressing portion 24a is formed such that the plate thickness of a base end portion thereof is large and the plate thickness (the length in the transverse direction) decreases toward the tip end side.

The regulating member 25 is integrally formed on the cover 20 such that the regulating member 25 is inserted to the inside of the case 10 from the opening 10a in the case 10 and is disposed at the position at which it is in contact with the upper surface of the main guide member 31 in a state where the cover 20 is provided at the position at which it closes the opening 10a in the case 10. A flat regulating surface 25a is formed on the lower surface of the regulating member 25.

That is, the regulating member 25 abuts on the upper surface of the main guide member 31 opposite to the main guide surface 31a which abuts onto the board 1 in the pressed state of the board 1, thereby regulating upward displacement of the main guide member 31 by a pressing force applied from the pressing member 24.

[Holding Form of Board]

The case structure A includes a pressing and holding portion H. When performing an operation of accommodating the board 1 inside the case 10 and closing the opening 10a in the case 10 by the cover 20, by applying a force caused by the closing operation to the board 1, the pressing and holding portion H sandwiches the board 1 between the main guide member 31 and the pressing member 24 and simultaneously, presses the main guide member 31 with the regulating member 25 so as to hold the board 1 on the case 10.

That is, the pressing and holding portion H includes the pressing member 24, the regulating member 25, and the main guide member 31, and in a state where the pressing member 24 is pressed against the lower surface of the board 1, a relative movement between the pressing member 24 and the board 1 is not possible and the board 1 is held by the cover 20 via the pressing member 24.

As described above, since the distance between the protruding end of the projection 33 and the main guide surface 31a is set to be smaller than the thickness of the board 1, when the board 1 is inserted along the guide path between the main guide member 31 and the sub guide member 32 as illustrated in FIGS. 7 and 8, the lower surface of the front end portion in the insertion direction of the board 1 is brought into strong contact with the projection 33 and crushes the protruding end of the projection 33 in a process of the front end portion in the insertion direction of the board 1 reaching the position at which it comes into contact with the inner surface of the bottom wall 14.

Thus, since the crushed portion of the projection 33 applies pressure to the lower surface of the front end portion in the insertion direction of the board 1 in a state where the front end portion in the insertion direction of the board 1 reaches the position at which it comes into contact with the inner surface of the bottom wall 14, the front end portion in the insertion direction of the board 1 is continuously pressed against the main guide surface 31a of the main guide member 31.

In this way, the cover 20 is held by the case 10 by setting the cover 20 at the position at which it closes the opening 10a in the case 10 in a state where the board 1 is accommodated in the case 10 and engaging the two engagement connection members 22 with the corresponding engagement projections 15. In this state, as illustrated in FIG. 9, the pressing member 24 is accommodated in the open space S below the main guide member 31 at the outer end side of the sub guide member 32.

In a state where the cover 20 remains in the engaged state with the case 10, the upper end portion of the pressing portion 24a of the pressing member 24 is in strong contact with the lower surface of the board 1. As a result of such strong contact, a portion of the upper end portion of the pressing portion 24a is crushed and continuously presses a rear end portion in the insertion direction of the board 1 against the main guide surface 31a of the main guide member 31.

Furthermore, when the pressing portion 24a of the pressing member 24 comes into contact with the lower surface of the board 1, the regulating surface 25a of the regulating member 25 functioning as the pressing and holding portion H comes into contact with the upper surface of the main guide member 31 (the surface opposite to the main guide surface 31a). As a result of such contact of the regulating surface 25a, since the regulating member 25 blocks the force applied to the main guide member 31 from the pressing member 24 to regulate the upward displacement of the main guide member 31, the board 1 may be held at an appropriate position.

As illustrated in FIG. 6, in a state where the cover 20 is provided at the position at which it closes the opening 10a in the case 10, the pressing member 24 and the regulating member 25 are disposed at positions to vertically face each other with the board 1 interposed therebetween. Therefore, the force transmitted from the pressing member 24 to the main guide member 31 through the board 1 may be easily blocked by the regulating member 25, and no force biased to the board 1 or the main guide member 31 is exerted.

[Functional Effects of Embodiment]

As described above, in the case structure A, when performing an operation of accommodating the board 1 inside the case 10 and closing the opening 10a in the case 10 by the cover 20, the board 1 is sandwiched between the main guide member 31 and the pressing member 24 constituting the pressing and holding portion H, and the projection 33 again presses the front end portion in the insertion direction of the board 1 against the main guide surface 31a. Thus, since a state where a region extending from the front end portion to the rear end portion of the board 1 in the insertion direction is pressed against the main guide surface 31a of the main guide member 31 is maintained, the board 1 is held against the case 10. At the same time, since the pressing member 24 holds the board 1 in a pressed state, the board 1 is also held against the cover 20.

Thus, even in a situation where external vibration is transmitted, the board 1 does not vibrate with respect to any of the case 10 and the cover 20 and no abnormal noise is generated.

Furthermore, when performing an operation of accommodating the board 1 in the case 10 and closing the opening 10a in the case 10 by the cover 20, the regulating surface 25a of the regulating member 25 comes into contact with the surface of the main guide member 31 opposite to the main guide surface 31a against which the board 1 is pressed by the pressing force of the pressing member 24. Thus, the regulating member 25 may prevent displacement of the main guide member 31 due to the force applied from the pressing member 24, thereby holding the board 1 at an appropriate position with the main guide member 31 interposed therebetween.

When performing an operation of closing the opening 10a in the case 10 by the cover 20, since the pressing member 24 may be accommodated in the open space S and the main guide member 31 and the pressing member 24 may be disposed at the position at which they overlap each other when viewed in the direction orthogonal to the board surface, the board may be strongly pressed against the guide surface of the guide member.

[OTHER EMBODIMENTS]

This disclosure may be configured as follows in addition to the above-described embodiment (the same reference numerals and symbols as those in the above-described embodiment are given to the components having the same functions as those in the above-described embodiment).

Figure 10:
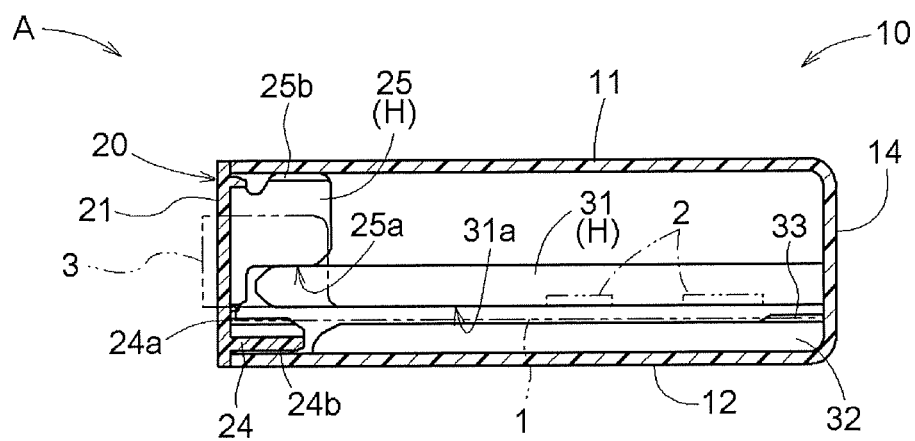
FIG. 10 is a longitudinal-sectional side view of case structures of additional embodiments (a) and (b)
Figure 11:
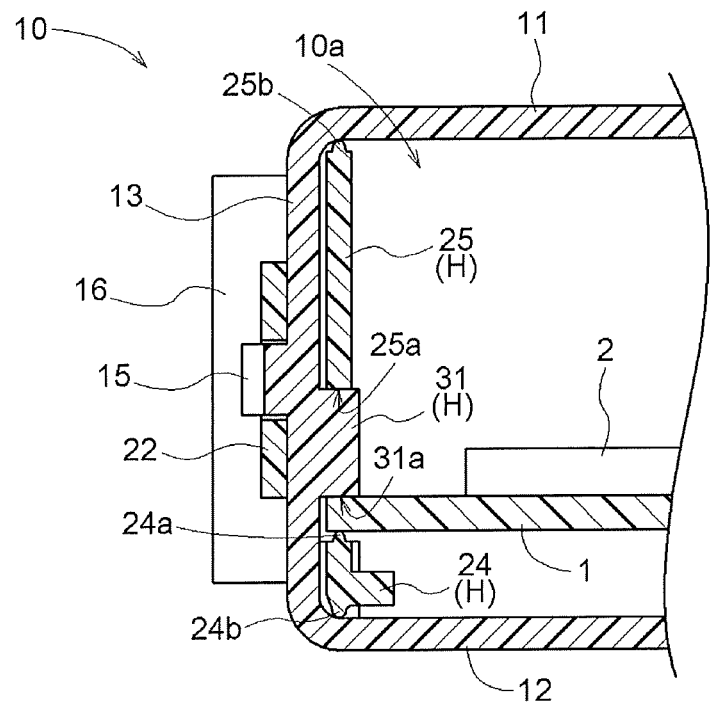
FIG. 11 is a cross-sectional view illustrating a pressing member and a regulating member of the additional embodiments (a) and (b)

(a) As illustrated in FIGS. 10 and 11, the regulating member 25 (an example of the pressing and holding portion) is formed on the opposite side of the regulating surface 25a with an abutting portion 25b which abuts onto the inner surface of the upper wall 11 of the case 10. That is, when the cover 20 is at the position at which it closes the opening 10a in the case 10, the regulating surface 25a of the regulating member 25 comes into contact with the upper surface of the main guide member 31 (the surface opposite to the main guide surface 31a) and at the same time, the abutting portion 25b of the regulating member 25 abuts onto the inner surface of the upper wall 11 of the case 10.

The regulating member 25 functions to regulate a phenomenon in which the main guide member 31 is displaced by the force applied from the pressing member 24, but is easily displaced in the direction in which it is lifted upward from the main guide member 31 by a reaction force applied from the main guide member 31.

On the other hand, as in the additional embodiment (a), by forming the abutting portion 25b on the regulating member 25, the force applied in the direction in which the main guide member 31 is displaced upward may be transmitted to the case 10 via the regulating member 25, whereby this displacement may be blocked by the regulating member 25 and the case 10, and the board 1 may be further reliably held at an appropriate position.

Although the additional embodiment (a) illustrates the abutting portion 25b having a plate-shaped structure in which the plate thickness decreases toward the upper end, instead of this configuration, the abutting portion 25b may use an abutting structure so as to become flat along the inner surface of the upper wall 11.

(b) As illustrated in FIGS. 10 and 11, the pressing member 24 (an example of the pressing and holding portion H) is formed on the opposite side of pressing portion 24a with a contact portion 24b which comes into contact with the inner surface of the lower wall 12 of the case 10. That is, when the cover 20 is at the position at which it closes the opening 10a in the case 10, the pressing portion 24a of the pressing member 24 comes into contact with the lower surface of the board 1 and at the same time, the contact portion 24b of the pressing member 24 abuts onto the inner surface of the lower wall 12 of the case 10.

The pressing member 24 functions to press the lower surface of the board 1 to apply pressure thereto, but is easily displaced downward from the board 1 by a reaction force applied from the board 1.

On the other hand, as in the additional embodiment (b), by forming the contact portion 24b of the pressing member 24, the force that displaces the pressing member 24 downward is transmitted to the case 10 via the pressing member 24, whereby this displacement may be blocked by the pressing member 24 and the case 10 and the force applied to the board 1 from the pressing member 24 may be reliably maintained.

Although the additional embodiment (b) illustrates the contact portion 24b having a plate-shaped structure in which the plate thickness is reduced toward the lower end, instead of this configuration, the contact portion may use a contact structure so as to become flat along the inner surface of the lower wall 12.

Meanwhile, the case structure A may be configured to have one of the configuration of the regulating member 25 of the additional embodiment (a) and the configuration of the pressing member 24 of the additional embodiment (b), and as illustrated in FIGS. 10 an 11, the case structure A may be configured to include both the configuration of the pressing member 24 of the additional embodiment (a) and the configuration of the regulating member 25 of the additional embodiment (b).

Furthermore, in the configuration having only the pressing member 24 of the additional embodiment (b), the length (width) of the main guide member 31 in the vertical direction may be increased to increase the rigidity of the main guide member 31. Thus, even if the board 1 is pressed against the main guide member 31 by the pressing member 24, the main guide member 31 does not easily deform, and the board 1 may be held at an appropriate position even without the regulating member 25.

Figure 12:
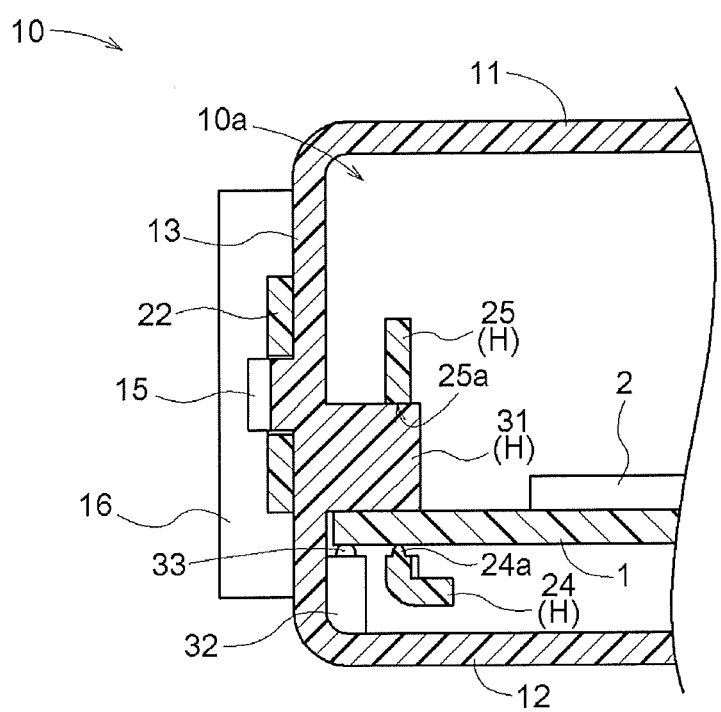
FIG. 12 is a cross-sectional view illustrating a pressing member and a regulating member of an additional embodiment (c)

(c) As illustrated in FIG. 12, the main guide member 31 is formed to extend more inward from the sidewall 13 (the right side in FIG. 12) than the sub guide member 32, and when viewed in the direction illustrated in FIG. 12, the pressing member 24 is pressed against the bottom surface of the board 1 at the position at which it does not overlap the sub-guide member 32, and the regulating member 25 is disposed above the pressing member.

In a configuration of the additional embodiment (c), since the pressing member 24 may be disposed at the position at which it does not overlap the sub guide member 32 when viewed in the direction illustrated in FIG. 12, the dimension of the sub guide member 32 in the guide direction may be set such that the sub guide member 32 reaches the vicinity of the opening 10a in the case 10, and when the board 1 is accommodated inside the case 10, the board 1 may be easily inserted into the guide path between the main guide member 31 and the sub guide member 32.

Figure 13:
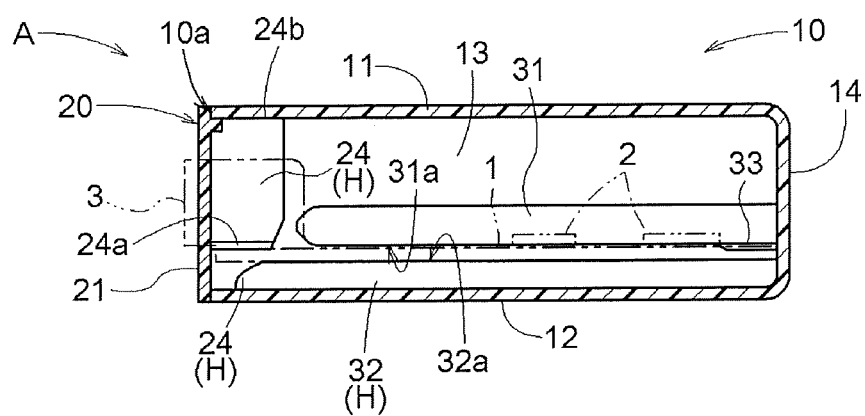
FIG. 13 is a longitudinal-sectional side view of a case structure of an additional embodiment (d).

(d) As illustrated in FIG. 13, in a state where the board 1 is accommodated in the case 10, the pressing portion 24a on the lower end of the pressing member 24 provided on the cover 20 is configured to come into contact with the upper surface of the board 1 and the contact portion 24b on the upper end of the pressing member 24 is configured to come into contact the inner surface of the upper wall 11 of the case 10.

In the additional embodiment (d), the pressing and holding portion H is configured by the pressing member 24 and the sub guide member 32. In this configuration, in a state where the cover 20 is provided at the position at which it closes the opening 10a in the case 10, the contact portion 24b of the pressing member 24 comes into contact with the inner surface of the upper wall 11 of the case 10, and the lower surface of the board 1 comes into contact with the sub guide surface 32a of the sub guide member 32.

Further, in the additional embodiment (d), the projection 33 which abuts onto the upper surface of the front end in the insertion direction of the board 1 when the board 1 is inserted into the case 10 protrudes downward from the main guide member 31. Meanwhile, as in the embodiment described above, the distance between the protruding end of the projection 33 and the sub guide surface 32a is set to be slightly smaller than the thickness of the board 1 and the plate thickness of the projection 33 is set to be smaller toward the protruding end. Furthermore, the plate thickness of the pressing portion 24a of the pressing member 24 is set to be smaller toward the protruding end.

In the additional embodiment (d), although the length in the guide direction of the sub guide member 32 is set so that the sub guide member 32 extends from the bottom wall 14 to the vicinity of the opening 10a, the main guide member 31 is formed in a shape in which a portion thereof close to the opening 10a is removed as compared with the sub guide member 32. Thus, in a state where the cover 20 is provided at the position at which it closes the opening 10a in the case 10, the pressing portion 24a on the lower surface of the pressing member 24 is disposed in a space formed at the outer end side of the main guide member 31.

In this configuration, since the sub guide member 32 is formed at the position at which it is in contact with the lower wall 12, the equivalent of the regulating member 25 described in the embodiment is not necessary, and by applying the pressing force of the pressing member 24 to the upper surface of the board 1, the board 1 may be brought into strong contact with the sub guide surface 32a of the sub guide member 32, and the board 1 may be supported in a state where it does not vibrate.

This disclosure may be used for a case structure accommodating a board therein.

As another configuration, the case may include a guide member having two guide surfaces that face respectively an upper surface side and a lower surface side of the board in order to guide the board inserted from the opening along a guide path, and the pressing and holding portion may include a pressing member that abuts onto the board and applies a pressing force pressing the board to one guide surface among the two guide surfaces.

According to this, by inserting the board between the two guide surfaces, the board may be inserted to the inside of the case along the guide path. Further, in a state where the opening in the case is closed by the cover, a pressing state is made such that the board is pressed against one of the two guide surfaces by the force applied from the pressing member so as to be sandwiched between the guide member and the pressing member. Thus, the board may be held in a state of being pressed against a guide body, and vibration of the board may be prevented.

As another configuration, the pressing and holding portion may include a regulating member that regulates displacement of the guide member due to the pressing force applied from the pressing member by abutting onto a surface of the guide member opposite to the guide surface against which the board is pressed by the pressing force from the pressing member.

According to this, in a state where the board is accommodated in the case and the opening in the case is closed by the cover, the board is pressed against one of the two guide surfaces by the pressing force from the pressing member, and in the guide member against which the board is pressed, the regulating member comes into contact with a surface of the guide member opposite to the surface against which the board is pressed. Thus, since displacement of the guide member due to the force applied from the pressing member may be blocked by the regulating member, the posture of the guide member may be stabilized, whereby the board may be hold better and vibration of the board may be prevented.

As another configuration, a projection that applies a pressing force in the same direction as a direction in which the pressing force by the pressing member is applied to the board by abutting onto a front end portion of the board in an insertion direction into the case may be provided on the other guide surface among the two guide surfaces.

According to this, in a case where the board is accommodated inside the case along the guide path, the projection comes into contact with the front end portion in the insertion direction of the board, and the board is pressed against the guide surface of the guide member by the pressing force applied from the projection. Since the direction in which the pressing force is applied is the same as the direction in which the pressing force is applied to the board from the pressing member, in a state where the opening in the case is closed by the cover, a region of the board from the front end portion to a rear end portion in the insertion direction is pressed against the guide surface of the guide member, and no gap is formed between the board and the guide member. Thus, vibration of the board may be further prevented.

As another configuration, a portion close to the opening in the guide member having the other guide surface among the two guide surfaces may be removed and a length in a guide direction of the guide member having the other guide surface among the two guide surfaces may be made shorter than a length in the guide direction of the guide member having the one guide surface such that an open space is formed at an outer end side of the guide member having the other guide surface, and the pressing member may be accommodated in the open space.

According to this, in the state where the board is accommodated in the case and the opening in the case is closed by the cover, the pressing member may be accommodated in the open space, and the pressing force from the pressure member accommodated in this manner may be applied to the board. In particular, in this configuration, since the guide member and the pressing member may be disposed at the position at which they overlap each other when viewed in the direction orthogonal to the board surface, the board may be strongly pressed against the guide surface of the guide member. Further, since the board is sandwiched and held between the pressing member and the guide member, a relative positional relationship between the board, the case, and the cover is uniquely determined, whereby the board may be held better and vibration of the board may be prevented.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A case structure comprising:
a case having an opening at one end side;
a cover configured to close the opening; and
a pressing and holding portion configured to press and hold a board against the case when the cover applies a force to the board in a state where the board is accommodated in the case and the cover is closed, wherein
the case includes a wide member having two guide surfaces that face respectively an upper surface side and a lower surface side of the board in order to guide the board inserted from the opening along a guide path, and
the pressing and holding portion includes
a pressing member provided on the cover that abuts onto the board and applies a pressing force pressing the board to one guide surface among the two guide surfaces, the pressing member including a pressing portion provided on an upper surface of the pressing member and protruding upward, and
a regulating member provided on the cover that regulates displacement of the guide member due to the pressing force when the pressing portion of the pressing member contacts the board by abutting onto a surface of the guide member opposite to the guide surface against which the board is pressed by the pressing force from the pressing member, the regulating member being disposed above the pressing member.

2. The case structure according to claim 1, wherein
a projection that applies a pressing force in the same direction as a direction in which the pressing force by the pressing member is applied to the board by abutting onto a front end portion of the board in an insertion direction into the case is formed on the other guide surface among the two guide surfaces.

3. The case structure according to claim 1, wherein
a portion close to the opening in the guide member having the other guide surface among the two guide surfaces is removed and a length in a guide direction of the guide member having the other guide surface among the two guide surfaces is made shorter than a length in the guide direction of the guide member having the one guide surface such that an open space is formed at an outer end side of the guide member having the other guide surface, and the pressing member is accommodated in the open space.

4. The case structure according to claim 2, wherein a portion close to the opening in the guide member having the other guide surface among the two guide surfaces is removed and a length in a guide direction of the guide member having the other guide surface among the two guide surfaces is made shorter than a length in the guide direction of the guide member having the one guide surface such that an open space is formed at an outer end side of the guide member having the other guide surface, and the pressing member is accommodated in the open space.

* * * * *